United States Patent

Ramamurthy et al.

[11] Patent Number: 5,848,026
[45] Date of Patent: Dec. 8, 1998

[54] INTEGRATED CIRCUIT WITH FLAG REGISTER FOR BLOCK SELECTION OF NONVOLATILE CELLS FOR BULK OPERATIONS

[75] Inventors: Srinivas Ramamurthy; Jinglun Eugene Tam, both of San Jose; Geoffrey S. Gongwer, Campbell, all of Calif.; James Fahey, Jr., Aix En Provence, France; Neal Berger, Cupertino; William Saiki, San Jose, both of Calif.

[73] Assignee: Atmel Corporation, San Jose, Calif.

[21] Appl. No.: 986,506

[22] Filed: Dec. 8, 1997

[51] Int. Cl.⁶ .......................................... G11C 8/00
[52] U.S. Cl. .................... 365/238.5; 365/230.03; 365/230.09
[58] Field of Search ................ 365/238.5, 230.03, 365/230.09, 201, 229, 189.12, 231, 185.29, 233, 185.11

[56] References Cited

U.S. PATENT DOCUMENTS

| | | | |
|---|---|---|---|
| 4,855,954 | 8/1989 | Turner et al. | 365/185 |
| 4,879,688 | 11/1989 | Turner et al. | 365/201 |
| 5,237,218 | 8/1993 | Josephson et al. | 307/465 |
| 5,388,083 | 2/1995 | Assar et al. | 365/218 |
| 5,412,260 | 5/1995 | Tsui et al. | 326/39 |
| 5,414,664 | 5/1995 | Lin et al. | 365/218 |
| 5,479,638 | 12/1995 | Assar et al. | 395/430 |
| 5,485,595 | 1/1996 | Assar et al. | 395/430 |
| 5,491,809 | 2/1996 | Coffman et al. | 395/430 |
| 5,596,530 | 1/1997 | Lin et al. | 365/185.29 |

*Primary Examiner*—David Nelms
*Assistant Examiner*—David Lam
*Attorney, Agent, or Firm*—Thomas Schneck; Mark Protsik

[57] ABSTRACT

Bulk operation logic circuitry for use in carrying out bulk program, erase, verify and margining operations on nonvolatile memory cells of a PLD, FPGA, flash-based microcontroller, EEPROM, flash memory device or other integrated circuit containing such cells includes a flag register for designating one or more selected blocks of cells to which the bulk operation will be limited. The bulk operation circuitry includes a controller, with a state machine and associated control logic, that distributes system clock signals and provides control signals to an instruction register, the flag register, an address register and one or more data registers to control loading of instructions and data into those registers through a serial input. The state machine is responsive to a mode signal for switching it from a normal user state into a bulk operation state. The use of a flag register allows simplification of the instruction set to register load instructions and basic bulk operation instructions (and a flow through operation using a serial output from the registers), while providing a wide variety of possible block selections for the different bulk operations.

17 Claims, 3 Drawing Sheets

| | 5 | 4 | 3 | 2 | 1 | 0 |
|---|---|---|---|---|---|---|
| 51 | ODD COLUMNS | EVEN ROWS | ALL ROWS | CONFIG ERASE ENABLE | ARRAY ERASE ENABLE | PIA ERASE ENABLE |

| IR CODE | INSTRUCTION NAME | AFFECTED REG. |
|---|---|---|
| 000 | LOAD FLAG | FLAG |
| 001 | LOAD DATA | DATA |
| 010 | LOAD ADDRESS | ADDRESS |
| 011 | PROGRAM | DATA |
| 100 | ERASE | DATA |
| 101 | VERIFY | DATA |
| 110 | MARGIN | DATA |
| 111 | FLOW THRU | ALL |

INTEGRATED CIRCUIT WITH FLAG REGISTER FOR BLOCK SELECTION OF NONVOLATILE CELLS FOR BULK OPERATIONS

TECHNICAL FIELD

The present invention relates to integrated circuits that include blocks of nonvolatile cells (EEPROM or Flash memory cells), such as programmable logic devices, field programmable gate arrays, Flash-based microcontrollers, and other configurable logic, as well as EEPROMs and Flash memory devices. The invention relates in particular to means, in such circuits, for addressing or selecting specified nonvolatile elements or groups of elements for erasure, programming, verifying, margining or other operations, and especially serial means for such selecting or addressing.

BACKGROUND ART

In-system programming and debugging of configurable logic is usually carried out with bulk operations on groups of nonvolatile memory cells, such as programming, erasing, verifying, reliability stress and margining operations. In logic chips, the memory cells can include those for configuring and programming functional blocks (also known as generic logic blocks) and input/output blocks (or macrocells), as well as other memory cells that interconnect the blocks with each other and to device pins so as to route the various signals within the device. Due to the complexity of such circuits and of the logic functions they are programmed to carry out, it is very useful to be able to easily debug and, if necessary, reprogram a device. To avoid having to erase and reprogram the entire chip whenever an error is found, it is useful to be able to select only those groups of cells (or 'blocks') that need to be corrected. Similarly, larger systems often include nonvolatile memory chips from which a program is loaded into other volatile chips when the system is first turned on. Different groups of cells in the nonvolatile memory chips may be assigned to a particular volatile chip of the system. For ease in altering the contents of selected portions of the nonvolatile memory, such memory chips are often partitioned into selectively programmable blocks.

Different methods have been used to select blocks of nonvolatile memory cells for the various bulk operations. In one such method, static voltage levels are applied to external pins or terminals of the device during its operation to select from the different cell groups and the different device operations. In particular, address pins specify which cell group is to be operated upon, wherein each address (i.e., set of pin levels) selects a unique, nonoverlapping set of cells. There is a one-to-one mapping between the decoded address and the set of cells selected for a particular device operation. For example, 10 address pins receiving binary input levels can select up to 1024 ($=2^{10}$) different cell groups. Other external pins select which type of operation is to occur. Data pins, typically eight or more in number, apply device data from the pins to the cells (for programming) or from the cells to the pins (for verify and margining operations). Typically, no input data is required for an erase operation. A disadvantage of this fully static approach is that the required number of external pins increases rapidly as the number of different cell groups and operations increases. Thus, to decode N unique cell groups for each of M different operations (using binary input pin levels) and applying data onto eight data pins requires at least $[\log_2(M \cdot N)]+8$ pins.

A second selection method applies the data to and from the device as a serial bit stream. For programming, the data values which are input serially through a single device pin are stored in data latches within the device and then transferred to the cells designated by the set of levels on the address pins. Erase and reliability stress operations may or may not require input data, depending on the design and device technology of the chip. For verify and margining operations, data is read from the cells into data latches, which can be the same latches as those used for programming. The latched data can then be streamed out onto a single data output pin. This serial bit stream technique reduces the number of pins required for data transfer to one (although some devices use two separate pins for data input and data output). As in the fully static method described earlier, the particular operation to be carried out and the particular cell group to be operated on are still specified by static levels applied to external pins of the device. The Atmel ATF16V8 devices use this data stream method with six address pins, three pins to select the operating mode, separate data pins for input and output, and one clock pin for a total of twelve pins. The fully static method would require 18 pins, assuming 8 bits of parallel data.

A third method applies both data and the encoded address as serial bit streams to respective data and address pins, and stores the bits in data and address latches prior to beginning the cell operation. There still exists a 1:1 mapping between the decoded address and the nonoverlapping cell groups, and the operation is still selected by applying static levels in parallel to multiple external pins of the device. The Atmel ATF22V10C is one example of a device using this technique. In that case, eight pins are required to fully specify the address, data input, data output and operating mode selection. However, the method still has the disadvantage of requiring more pins for increasing numbers of selectable cell operations.

A fourth selection technique uses serially streamed data, address and instruction codes. That method is taught in U.S. Pat. Nos. 4,855,954 to Turner et al., 5,237,218 to Josephson et al. and 5,412,260 to Tsui et al., as well as in IEEE Spec. 1149.1 (commonly referred to as the Joint Test Action Group [JTAG] spec.) This standardized method employs an internal state machine, a set of shift registers and only four device pins to implement the various operations. The state machine includes normal user, command load, and program execute states which can be changed by driving the mode, clock, and serial data input (SDI) pins in an appropriate manner. There is also a serial data output (SDO) pin that allows multiple devices to be serially connected or cascaded together in a daisy-chain fashion for the bulk programming and test operations. These control pins can be made available by multiplexing pins that are used as functional pins when the state machine is in its normal user mode. In addition to their use in in-system programming (ISP) operations, the control pins can also be shared by boundary-scan operations (which may employ a separate state machine). The shift registers include an instruction register, an address register and one or more data registers. When the state machine is in its command load state, a command or instruction is serially shifted via the SDI pin into the instruction register and then decoded. In the program execute state, the decoded instruction is executed. The instructions can include commands to serially shift an address into the address register, to serially shift data into one of the data registers, and program, erase or verify a group of nonvolatile cells at the address indicated by the address register, using the data in a particular data register where necessary. (Erase operations do not require any data from a data register.) Different instructions may not only select the different types of operations to be executed, but also specify different groups or blocks of cells (possibly overlapping) to be operated on. For example, the Tsui et al. patent lists several different instructions for cell erasure, including architecture block erase (ARCHBE), logic array block erase (ARRBE), programmable interconnect array block erase (PIABE) and global block erase (GBE).

An advantage of the JTAG method is that it requires only four pins to implement. Since the method is standardized, development of the programming and test hardware, and the software to support it, is relatively simple for both the device manufacturer and the user. By adding different instructions for different cell blocks, the same basic type of operation can be carried out for different (possibly overlapping) blocks of cells, adding considerable flexibility for device verification and characterization. Use of overlapping cell groups can help to more quickly isolate any device functional failures, more easily characterize operational range limits of different cell groups, and allow for faster production device testing. However, a disadvantage of this approach is that, as more instructions are added, the instruction decoder becomes more complicated. To provide a selection of N different cell groups for each of N different types of operations requires N×M instructions.

A fifth method replaces the address register and internal address decoder of the JTAG method with one latch bit for each group of cells that must be individually selectable for any one cell operation. A fully decoded address is then streamed into the set of latches. For example, the Altera MAX PLD cell array implements this method with a row latch that includes one bit for each row of cells in the array. Data latches store one data bit for each array column, and data is streamed into the data latches. The row and data latches together select which bits are selected for a bulk operation. Each nonvolatile cell in the array is uniquely identified by its associated row latch bit and data latch. Also, by setting multiple row latch bits, any set of rows can be simultaneously selected, thereby providing flexible overlapping cell group capability. However, since programming of rows must be individually selectable, the method requires a separate latch bit for each row, so that large numbers of latch bits are needed in devices with large numbers of rows. Another disadvantage is that the row latch bits divide the cell groups within the array the same way for every kind of operation. Also, while only the rows being operated on will require a different bit value, all row latch bits must still be loaded with data for all cell operations. All of this adds time and cost for large devices.

A number of nonvolatile memory devices employ flags to maximize the endurance or usable life of such devices by minimizing the number of erase cycles that each memory cell must undergo. For example, in U.S. Pat. No. 5,491,809, Coffman et al. disclose a method of erasing block-erasable nonvolatile memories, such as flash EPROMs, that eliminates unnecessary erasing of blocks of memory cells to avoid over-erasure and low endurance problems, and which can also secure specified blocks from being erased and modified. The method employs a memory controller that includes a "skipdat" latch for each block. Each skipdat latch functions as a flag register for a particular block, indicating to the memory controller whether that block (1) is already in an erased state and therefore does not need to be erased, or (2) has been secured to prevent its erasure, or (3) is neither erased nor secured. The memory controller controls the erasing operation so that erasure is not attempted of any blocks that have been flagged as either already erased or secured from erasure. Because every block into which the memory device is partitioned requires its own skipdat latch, the number of such latches can be quite large. As another example, in U.S. Pat. Nos. 5,414,664 and 5,596,530, Lin et al. describe a flash EPROM device organized into blocks of memory cells, which uses an erase verify circuit, block erase flags and control logic to re-erase only those blocks that fail the erase verify operation, thereby avoiding overerasure of already properly erased blocks. An erase operation begins by setting block erase flags for the selected blocks. All blocks having a set flag are erased. The erase verify operation verifies erasure of the blocks having a set flag and then resets or clears the flags of those blocks that pass the verify test. A re-erase operation then occurs only for those blocks where the flag remains set, that is, which failed the erase verify test.

In U.S. Pat. Nos. 5,388,083; 5,479,638; and 5,485,595, Assar et al. describe a flash memory architecture for replacing a hard disk drive. Because flash memory cells have just a finite number of erase-write cycles before they eventually fail, in order that the flash memory can be used as a mass storage device, the memory device uses a wear leveling technique that employs a set of 'used/free' and 'old/new' flags, (1) to identify memory blocks that have information stored in them (used) or are empty (free), and (2) to indicate which of the used blocks contain superseded versions of a file (old) and which contain the current version of a file (new). When updating a file, the modified file is written to empty blocks only, that is only to blocks labeled as 'free'. The written blocks are then labeled as 'used' and 'new', while the blocks that have been superseded are relabeled as 'old'. When the memory device becomes full, a multi-sector erase cycle is performed to erase those blocks where the old/new flag has been set to 'old'. An 8-bit flag or register keeps track of the erase count for each block. Whenever the erase count for any particular block approaches a predetermined maximum, that block's contents are moved to an empty block having the smallest number of erase cycles and an 'erase inhibit' flag is set for the heavily erased block. After all blocks have reached the predetermined maximum, the erase counter and inhibit flags are cleared, and the algorithm repeats. This method thus ensures that no one block is erased substantially more often than any other block. The various flags, together with a correspondence map between the logic address used by a computer and the actual physical address in the memory architecture, can be stored in a nonvolatile memory. Again, the number of flags increases with increasing numbers of blocks (which correspond to hard drive sectors).

An object of the invention is to provide an integrated circuit with nonvolatile cells and an in-system programming method by which different groups of the nonvolatile cells of the circuit may be selected for various bulk operations using a minimum number of required external pins, instructions and internal storage bits.

DISCLOSURE OF THE INVENTION

The object is met by bulk operation logic circuitry in an integrated circuit that incorporates a flag register for designating a selected block of nonvolatile memory cells of the integrated circuit to which a bulk operation will be limited until bits in the flag register are changed to designate a different block. The bulk operation logic circuit develops and improves upon the prior JTAG method discussed above so that the instruction set is simplified, while providing greater flexibility in the number of different groups or blocks of cells that can be operated upon in a bulk operation. (A bulk operation is an operation that is carried out, either simultaneously or sequentially, on an entire block of memory cells in a device, e.g., an erase of all cells programming an interconnect array in an FPGA device. Common bulk operations include programming, erasing, verifying and margining.)

In addition to the flag register, the bulk operation logic circuitry includes an address register, one or more data registers, an instruction register with associated instruction decoding means, and a bulk operation controller, which may be made up of a state machine and associated control circuitry. As in the prior JTAG circuits, the logic requires only four external pins for a mode signal, a system clock, a serial input and a serial output. The various registers receive encoded instructions, flag bits, address bits, and data serially via the serial input terminal. The serial output allows multiple devices to be daisy-chained together and the serial input bits to flow through their respective registers to the serial output terminal and on to the next device in the chain. The controller, and in particular its state machine, is responsive to a mode signal and a system clock signal for transitioning between a normal user state and a bulk operation state. The controller distributes clock signals from the system clock input to the various registers and provides control signals to carry out loading of an instruction into the instruction register and execution of the decoded instruction, including loading of the other registers, during a bulk operation state of the state machine. The flag register interacts with an address decoder of the integrated circuit so that only a selected block of cells designated by the flag bits stored in that register is enabled for a bulk operation.

A method for carrying out a bulk operation on the integrated circuit includes the steps of switching the controller's state by means of a mode signal from a normal user state to a bulk operation state, alternately loading a register load instruction into the instruction register and loading one or more flag, address or data bits into the respective flag, address or data registers, loading a bulk operation instruction into the instruction register, and executing the bulk operation designated by the instruction using one or more flag, address and data registers. The executed bulk operation is limited only to the block or blocks of cells selected by the flag register.

BEST MODE OF CARRYING OUT THE INVENTION

Figure 1:
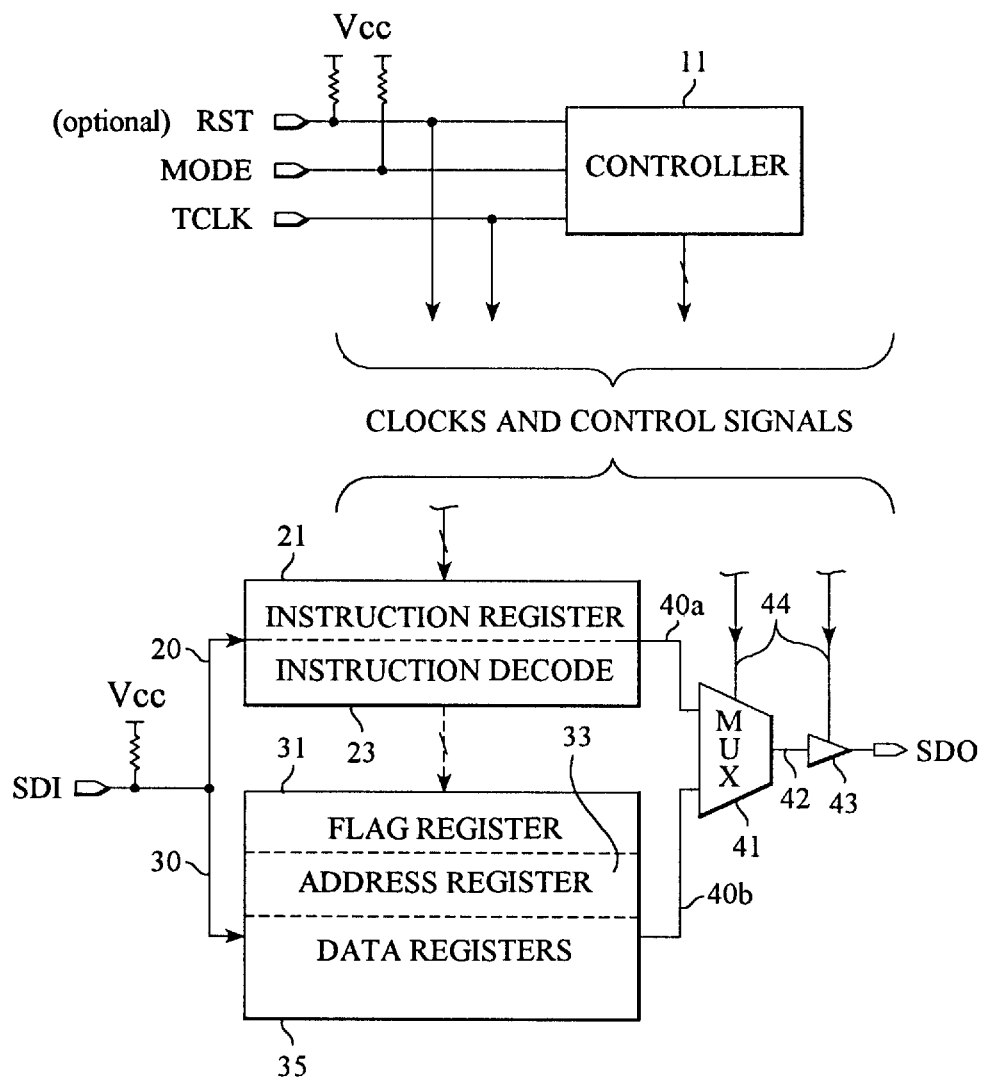
FIG. 1 shows a block diagram of the bulk operation logic according to the present invention.
Figure 2:
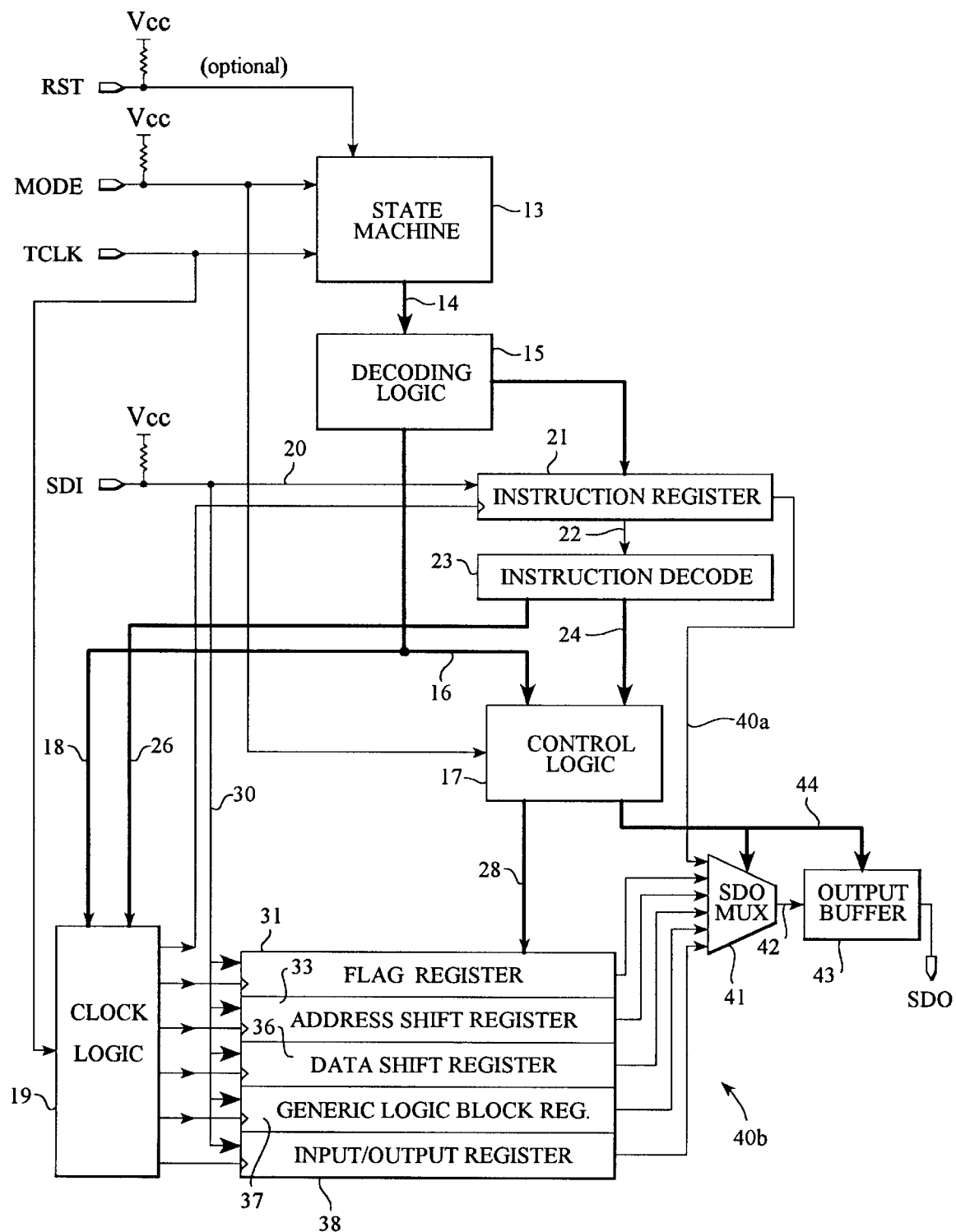
FIG. 2 shows a more detailed block diagram of the logic of FIG. 1 according to a preferred embodiment of the present invention.

With reference to FIGS. 1 and 2, an integrated circuit with nonvolatile cells having bulk operation capability uses the logic shown to provide that capability. Much of the hardware is basically like that used to implement boundary scan and in-system programming according to the JTAG Standard (IEEE 1149.1-1990), but with further improvements that permit the block selections of the present invention. The integrated circuits having such bulk operation capability include programmable logic devices (PLDs), field programmable gate arrays (FPGAs), flash-based microcontrollers and other configurable logic containing EEPROM or flash memory cells, as well as nonvolatile memory chips, such as EEPROMs and flash memory devices that are partitionable into individually selectable blocks. Bulk operations include programming, verifying, margining and erasure, where entire blocks of nonvolatile cells are selected for the particular operation. The designated blocks or groups of cells may overlap with other designated blocks, and different operations might be carried out on distinct sets of blocks.

Figures 3, 4, 5:
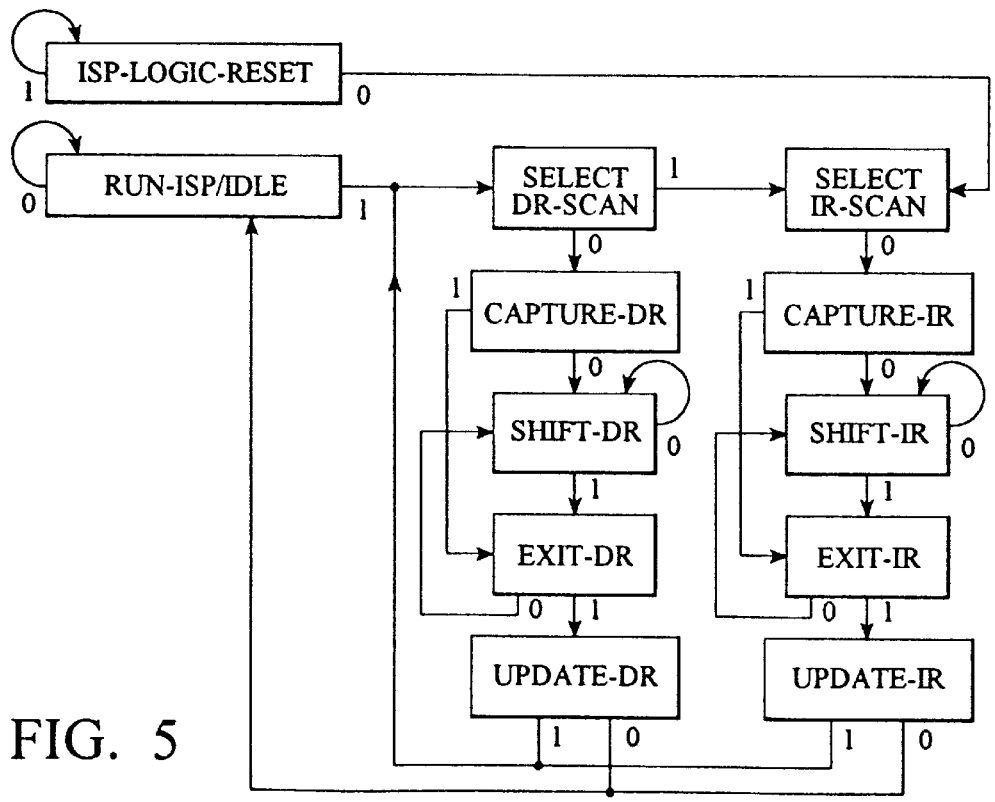
FIG. 3 shows exemplary bit assignments for a flag register in the logic of FIGS. 1 and 2.
FIG. 4 shows a table of in-system programming instructions for loading into an instruction register in the logic of FIGS. 1 and 2 to carry out the bulk operations in accord with the present invention.
FIG. 5 shows a state diagram for a controller state machine in the logic of FIGS. 1 and 2.

The bulk operation logic circuitry includes a controller 11 responsive to mode, clock and reset signals provided on terminals MODE, TCLK and RST respectively for providing clock signals and control signals to the rest of the logic circuitry, including the registers. The controller 11 may comprise a state machine 13, decoding logic 15, control logic 17 and clock logic 19, all connected via control lines 14, 16 and 18. The state machine 13 can be implemented as a PLA-type circuit for processing a set of state equations based on the present machine state and the signal levels from the MODE, TCLK and RST terminals, in accordance with IEEE Standard 1149.1-1990. A representative state diagram is shown in FIG. 5, discussed below. The state of the state machine 13 is decoded by the decoding logic block 15, and the decoded state is used to control the control logic block 17 and the clock logic 19. The control logic 17 controls the various registers, as further described below. The clock logic 19 receives the clock signal from the TCLK terminal and provides input clock signals to the registers.

The bulk operation logic circuitry also includes an instruction register 21 with an associated instruction decoding circuit 23. Instructions are received from the serial data input (SDI) terminal via signal line 20 and shifted into the instruction register 21 in accordance with the decoded state of the state machine 13. The decoded instructions are provided to the control logic block 17, which then directs data received at the SDI terminal to a selected one of the registers 31, 33, 35 (36–38) according to the decoded instructions.

A unique feature of the logic circuitry of the present invention is the provision of a flag register 31 for designating blocks of nonvolatile cells to be operated on during a bulk operation. This is discussed in greater detail below. Other registers include an address register 33 and one or more data registers 35. Only one data register is absolutely essential. Use of multiple data registers may simplify layout of the programming lines leading from these registers to groups of nonvolatile cells to be programmed. Thus, one data register 38 may be dedicated to configuring input/output macrocells of a device, another data register 37 may be dedicated to configuring and programming the nonvolatile cells in each generic logic block (e.g., in an FPGA), and yet another data register 36 may be dedicated to programming other nonvolatile cells of a device, such as for a programmable interconnect array (PIA). Different types of devices may have different numbers of data registers.

The circuitry of FIGS. 1 and 2 also includes a multiplexer 41 with its output 42 connected via an output buffer 43 to a serial data out (SDO) terminal. The SDO terminal allows multiple devices to be chained together in series for in-system programming of all of the devices. The SDO multiplexer 41 receives an input 40a from an output of the instruction register 21 and other inputs 40b from outputs of the various other registers 31, 33, 35, (36–38). The control logic block 17 provides control signals on lines 44 to enable (or disable) the output buffer 43 and to select which of the inputs to the multiplexer 41 will be provided via the buffer 43 to the SDO terminal. Thus, when the output buffer 43 is enabled, data shifted in from the SDI terminal is transferred through the selected register and multiplexer 41 to the SDO terminal, and thereby passed to the next device in the chain. This enablement occurs in response to a FLOWTHRU instruction (e.g., instruction register (IR) code 111).

As previously mentioned, a primary feature of the present invention is the use of a flag register 31 to control which cells are operated upon by a subsequent device operation. The flag register is made up of a set of latches storing flag bits. Each flag bit's output modifies associated logic of the device, e.g., address decoding circuitry, so that a specified block of cells is selected. A bulk operation (for example, erasure of selected cells of a programmable device) can be carried out using the flags set in the flag register, or a combination of the flag register with the address register, as in implied addressing, or alternatively by straight addressing with the address register alone. FIG. 3 shows one possible example of a six-bit flag register and typical flag bit assignments. Bits 0, 1 and 2, for instance, designate specified blocks of nonvolatile cells in an FPGA device that are respectively responsible for the programmed connections of a programmable interconnect array (PIA), the programmed function of a logic array block, and the specific configuration or architecture of logic and I/O blocks. Moreover, these bits enable those blocks of cells only for an erasure operation and not for other bulk operations. In contrast, bits 3, 4 and 5, when set, apply to all bulk operations, including programming, erasure, verification and margining. Bit 3 selects all rows of a nonvolatile cell array, while bits 4 and 5 designate only a subset of those cells, such as even or odd rows or columns of cells. Thus, if flag bit 1 is set (e.g., to logic level 1), an erase operation will be executed on nonvolatile cells for one section of the chip, namely the programmable interconnect array, after the erase instruction has been loaded into the instruction register, while if flag bit 2 is set, an erase operation will be executed in another portion of the chip, namely in the logic array blocks in this example. Similarly, other flag bits select cells for still other parts of the device for a bulk operation designated by the instruction received by the instruction register. Note that the groups specified by the different bits can overlap so that any particular cell might be selected by more than one bit. Moreover, these need not be sufficient flag bits to provide the capability of uniquely identifying (in combination with data latches) each individual cell within a cell array. Rather, some operations may use the encoded address in the address register to select array bits, for example for programming of cells, while other operations may use a combination of both flag and address bits to determine the selected cells. Thus, a flag bit might enable only the even numbered rows (e.g., flag bit 4 in FIG. 3), while the encoded address in the address register might select a particular row, which is either enabled or disabled depending upon whether it is an even or odd numbered row. Alternatively, in implied addressing, the addresses in the address register may be reused in different sections of the device, with the flag bits specifying which section is to be operated on. In that case, the flag bits effectively become an integral part of the address. Preferred devices also allow traditional addressing without use of the flag register, such as when the entire device is to be programmed, one address at a time. Some instructions may be executed by referring to the flag register's contents, and other instructions might be executed with the flag register being ignored.

The flag register can be of any size, and different bits can be associated with one or more particular operations. There could also be multiple flag registers, each dedicated to control of a particular operation. While the preferred flag register is a shift register for serial input through a single pin, parallel input of flag bits from multiple device pins could be used, if speed is required. Also, while the flag bits are normally used to designate nonvolatile cells, for some test operations, it may be desirable to also select volatile cells (such as SRAM cells). Thus, some designated groups may include a combination of volatile and nonvolatile cells, or even volatile cells only.

With reference to FIG. 4, the set of instructions for implementing a bulk operation is considerably reduced by the provision of a flag register for designating cell groups. Prior devices that have employed encoded instructions required multiple instructions to implement the same basic operation on different cell groups. This is no longer necessary. Instead, an instruction specifies the operation, while the flag register identifies the cell group to be operated upon, possibly in combination with the address register. The instruction set includes instructions (000, 001 and 010) to load the various specific data registers, including the flag register, address register, and one or more data registers proper. If more than one data register is used, the contents of the flag register 31 may be read by the control logic 17 to control which data register 36, 37 or 38 is loaded. The instruction set also includes instructions (011, 100, 101 and 110) directing execution of a particular bulk operation, including program, erase, verify and margin. Lastly, one instruction (111) directs the control logic to enable the output buffer to the SDO terminal and allow passage of the next instruction, flag, address or data sequence from the SDI terminal through the affected register to the SDO terminal. Other instruction sets are possible.

With reference to FIG. 5, the state machine 13 of FIG. 2 is implemented in accordance with IEEE Standard 1149.1-1990. Timing of the state machine is provided by the clock signal on the TCLK terminal. The state machine usually has several possible states, including a normal user state, a command load state and a program execute state. The latter two states may be collectively referred to a bulk operation state with alternating load and execute cycles. The machine state is changed by means of the mode signal provided on the MODE terminal, in combination with signals received by the TCLK and SDI terminals. Thus, for example, if MODE=high and SDI=low at a clock signal transition, the machine state may change to the normal user, if it isn't already in that state. If MODE=high and SDL=high, the machine state may change from the normal user state to the command load state, or if it is already in one of the bulk operation states, it will switch between the command load state and program execute state. If MODE=low, then the state is unchanged, and the SDI terminal is a data input terminal. In a normal user state, the state machine prevents programming or other alteration of the nonvolatile cells and the device operates as previously programmed. This is the default state upon power up or upon receipt of a reset signal on the optional terminal RST. Once in a bulk operation state, the state machine takes over control of such bulk operations as programming, erasure, verifying and margining, according to the state diagram shown in FIG. 5. A typical program sequence is set forth as follows, where DR refers to any of the date registers (including the flag and address registers) and IR refers to the instruction register:

(1) Logic Reset
(2) Run ISP (3) Select DR Scan
(4) Select IR Scan
(5) Capture IR
(6) Shift IR; repeat for N cycles (N=IR length)
   Comment: Instruction=LOAD FLAG
(7) Exit IR
(8) Update IR
(9) Select DR Scan
(10) Capture DR
(11) Shift DR; repeat for M cycles (M=Flag Register Length)
   Comment: Data=Flag Bit data
(12) Exit DR
(13) Update DR
(14) Select DR Scan
(15) Select IR Scan
(16) Capture IR
(17) Shift IR; repeat for N cycles
   Comment: Instruction=LOAD ADDRESS
(18) Exit IR
(19) Update IR
(20) Select DR Scan
(21) Capture DR
(22) Shift DR; repeat for K cycles (K=Address Register length)
   Comment: Data=Programming Address
(23) Exit DR
(24) Update DR
(25) Select DR Scan
(26) Select IR Scan
(27) Capture IR
(28) Shift IR; repeat for N cycles
   Comment: Instruction=PROGRAM
(29) Exit IR
(30) Update IR
(31) Run ISP/Idle
(32) Select DR Scan etc.

It can be seen in this example that the sequence of steps first load the instruction LOAD FLAG, then execute that instruction by loading the desired flag data into the flag register. Next, the instruction LOAD ADDRESS is loaded into the instruction register, then executed by loading the selected address into the address register. Assuming data has already previously been loaded into a data register, when the PROGRAM instruction is loaded into the instruction register, programming will begin when the state machine enters the Run ISP/Idle state and will end when the state machine leaves that state. However, state machine control of the actual programming interval is not required by this invention.

The use of a flag register to designate cell groups to be operated upon, considerably simplifies the required instruction set, and consequently simplifies the instruction decoding circuitry. The flag register also allows many possible groups or blocks of cells, possibly overlapping one another, to be designated, and different operations may work on different cell groups without complicating the instructions. By carrying out bulk operations, such as erasure, only on specified sectors or blocks of cells, a considerable amount of test time can be saved, as a user does not have to reprogram other parts of the chip. Logical testing is made simpler when parts of the chip can be specifically programmed and erased, reducing test time and more reliably ensuring the usability of the chip.

We claim:

1. In an integrated circuit containing nonvolatile memory cells, bulk operation logic circuitry for selecting one of a plurality of blocks of said nonvolatile cells and carrying out a designated operation on said selected block, the bulk operation logic circuit comprising:

a bulk operation controller responsive to a mode signal and a system clock signal for transitioning between a normal user state and a bulk operation state of the integrated circuit, said controller providing clock signals and control signals when in said bulk operation state, an instruction register with associated decoding means, the instruction register connected to a serial input and responsive to a control signal from said controller for receiving instructions via said serial input, said instructions being decoded by said associated decoding means, said decoded instructions being provided to said controller, and a data register, an address register, and a flag register all connected to said serial input and responsive to control signals from said controller corresponding to said decoded instructions, said flag register interacting with an address decoder of the integrated circuit to limit execution of a bulk operation on said nonvolatile cells to only a selected one of said blocks of cells designated by flag bits received by said flag register through said serial input.

2. The circuitry of claim 1 wherein the integrated circuit in which the bulk operation logic circuitry is situated is a logic device selected from the group consisting of programmable logic devices, field programmable gate arrays and flash-based microcontrollers which are configured and programmed by means of said nonvolatile memory cells.

3. The circuitry of claim 1 wherein the integrated circuit in which the bulk operation logic circuitry is situated is a nonvolatile memory device partitioned into blocks.

4. The circuitry of claim 1 wherein the set of instructions that are decodable by the decoding means associated with said instruction register includes register load instructions directing the controller to load one of said data, address and flag registers with bits serially received through said serial input and bulk operation instructions directing the controller to execute a bulk operation on said nonvolatile cells.

5. The circuitry of claim 4 wherein bulk operation instructions include an erase instruction for erasing the block of cells designated by said flag register.

6. The circuitry of claim 4 wherein said bulk operation instructions include a program instruction for programming data from said data register at an address designated by said address register into the block of cells designated by said flag register.

7. The circuitry of claim 4 wherein said bulk operation instructions include a verify instruction for verifying memory contents at an address designated by said address register in a block of cells designated by said flag register, said memory contents being readable into said data register for output from said data register through a serial output connected to said data register.

8. The circuitry of claim 4 wherein said bulk operation instructions include a margining instruction for said block of cells designated by said flag register.

9. The circuitry of claim 4 further comprising a serial output connected through selection means to each of said instruction register, data register, address register and flag register, said set of instructions further including a flow through instruction directing the controller to pass bits serially received through said serial input through a selected register to said serial output.

10. The circuitry of claim 1 wherein said bulk operation controller comprises a state machine and associated control circuitry.

11. The circuitry of claim 1 wherein bit assignments of said flag register respectively designate different overlapping groups of nonvolatile cells as said blocks.

12. The circuitry of claim 1 wherein said blocks of cells designated by said flag register are of different sizes from other designated blocks.

13. The circuitry of claim 1 wherein at least one block of cells designated by said flag register includes volatile memory cells.

14. A method of carrying out a bulk operation on an integrated circuit containing nonvolatile memory cells organized into blocks of cells, the method comprising:

(a) switching a state of a bulk operation controller of said integrated circuit from a normal user state to a bulk operation state by means of a mode signal applied to said controller, (b) under control of said bulk operation controller, alternately loading a register load instruction into an instruction register of said integrated circuit and, responsive to said register load instruction, loading one or more sets of flag, address and data bits into respective flag, address and data registers of said integrated circuit through a serial input connected to said registers, (c) loading a bulk operation instruction into said instruction register, and (d) executing a bulk operation designated by said bulk operation instruction in said instruction register, said bulk operation being limited only to one or more blocks of cells selected by flag bits in said flag register, at least some bulk operations using contents of said address and data registers as well as said flag bits.

15. The method of claim 14 further comprising repeating steps (b)–(d) with said flag bits in said flag register remaining unchanged, and at least said address register being reloaded with different address bits for the same bulk operation instruction.

16. The method of claim 14 wherein said bulk operation instructions include one or more of the instructions selected from the group consisting of erase, program, verify and margining operation instructions.

17. The method of claim 14 wherein bit assignments of said flag register respectively designate different overlapping groups of nonvolatile cells as said blocks.

* * * * *